United States Patent
Lee

(10) Patent No.: US 10,304,910 B2
(45) Date of Patent: May 28, 2019

(54) DISPLAY DEVICE INCLUDING TOUCH SCREEN

(71) Applicant: G2TOUCH Co., LTD, Seongnam (KR)

(72) Inventor: Sung Ho Lee, Hwaseong (KR)

(73) Assignee: G2TOUCH CO., LTD., Seongnam (KR)

( * ) Notice: Subject to any disclaimer, the term of this patent is extended or adjusted under 35 U.S.C. 154(b) by 0 days.

(21) Appl. No.: 15/832,471

(22) Filed: Dec. 5, 2017

(65) Prior Publication Data

US 2018/0175117 A1    Jun. 21, 2018

(30) Foreign Application Priority Data

Dec. 15, 2016 (KR) .......................... 10-2016-0171404

(51) Int. Cl.
- *H01L 27/32* (2006.01)
- *G06F 3/041* (2006.01)
- *G06F 3/044* (2006.01)
- *H01L 51/52* (2006.01)

(52) U.S. Cl.
CPC ............ *H01L 27/323* (2013.01); *G06F 3/044* (2013.01); *G06F 3/0412* (2013.01); *H01L 51/5203* (2013.01); *G06F 2203/04112* (2013.01)

(58) Field of Classification Search
USPC ........................................................ 345/174
See application file for complete search history.

(56) References Cited

U.S. PATENT DOCUMENTS

| | | | |
|---|---|---|---|
| 2009/0322702 A1* | 12/2009 | Chien | G06F 3/0412 345/174 |
| 2014/0232691 A1* | 8/2014 | Lee | G06F 3/044 345/174 |
| 2014/0353691 A1* | 12/2014 | Lee | H01L 27/323 257/88 |
| 2015/0097802 A1* | 4/2015 | Kim | G06F 3/044 345/174 |
| 2015/0145818 A1* | 5/2015 | Jeon | G06F 3/044 345/174 |
| 2016/0054846 A1* | 2/2016 | Lee | G06F 3/0416 345/174 |
| 2017/0300160 A1* | 10/2017 | Tsai | G06F 3/0412 |
| 2018/0143729 A1* | 5/2018 | Lee | G06F 3/0416 |

\* cited by examiner

Primary Examiner — Chineyere D Wills-Burns

(57) ABSTRACT

Disclosed herein is a display device including a touch screen. An organic light emitting diode (OLED) display device including a touch screen according to an exemplary embodiment of the present invention includes: a plurality of pixels including organic light emitting bodies; and a common electrode which applies a common voltage to the organic light emitting body, in which a plurality of touch sensors and a plurality of sensor lines are formed in a mesh pattern in a partial region of the common electrode corresponding to a boundary region between the organic light emitting bodies. Further, the present invention includes exemplary embodiments different from the described exemplary embodiment.

12 Claims, 16 Drawing Sheets

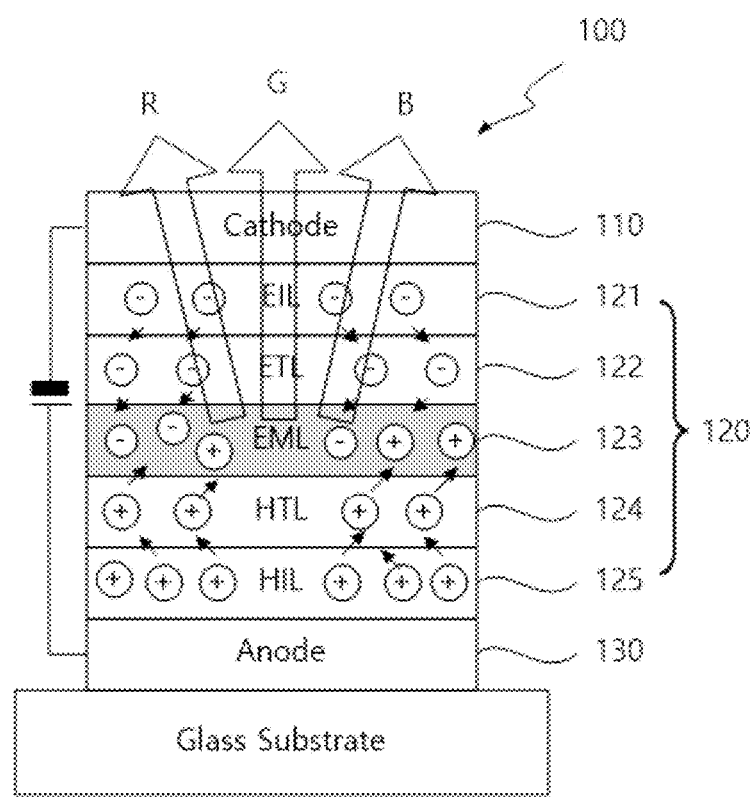
[FIG 1]

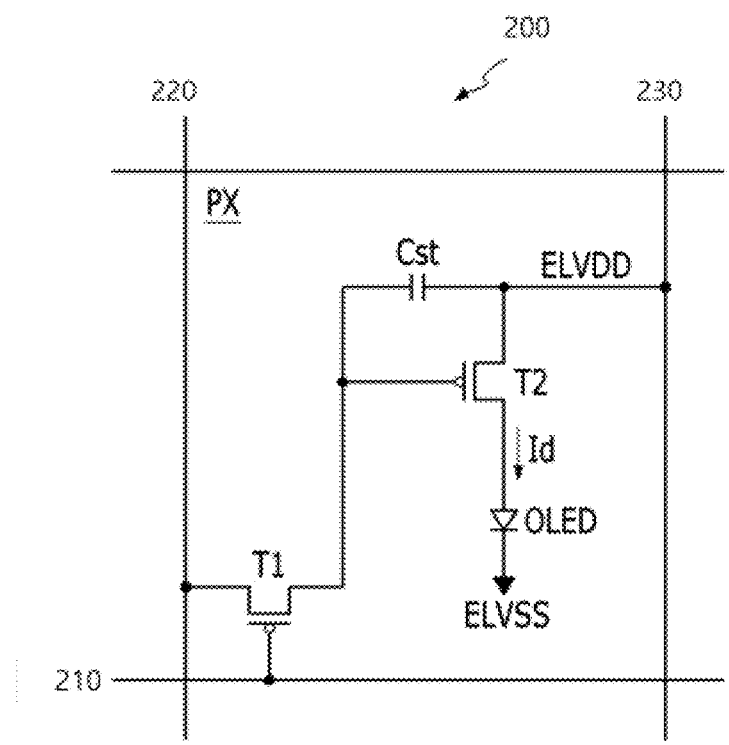
[FIG 2]

[FIG 3]
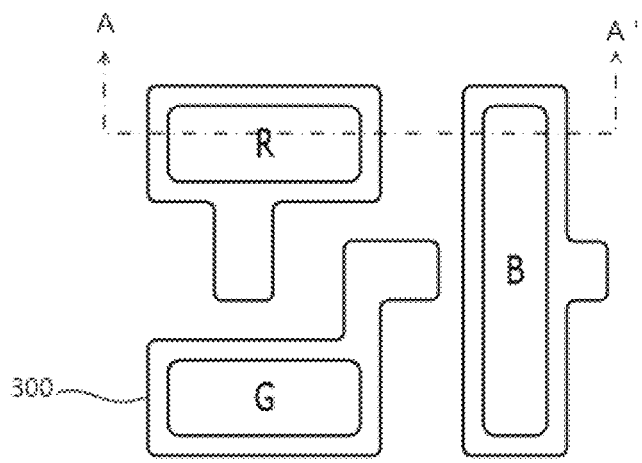
[FIG 4]
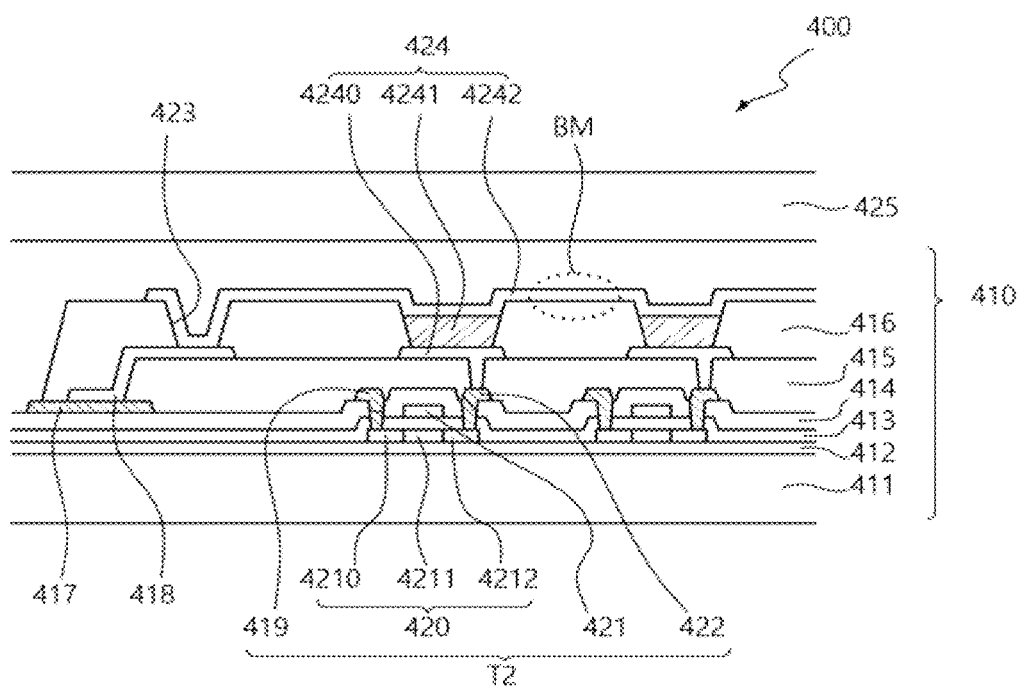

[FIG 5]
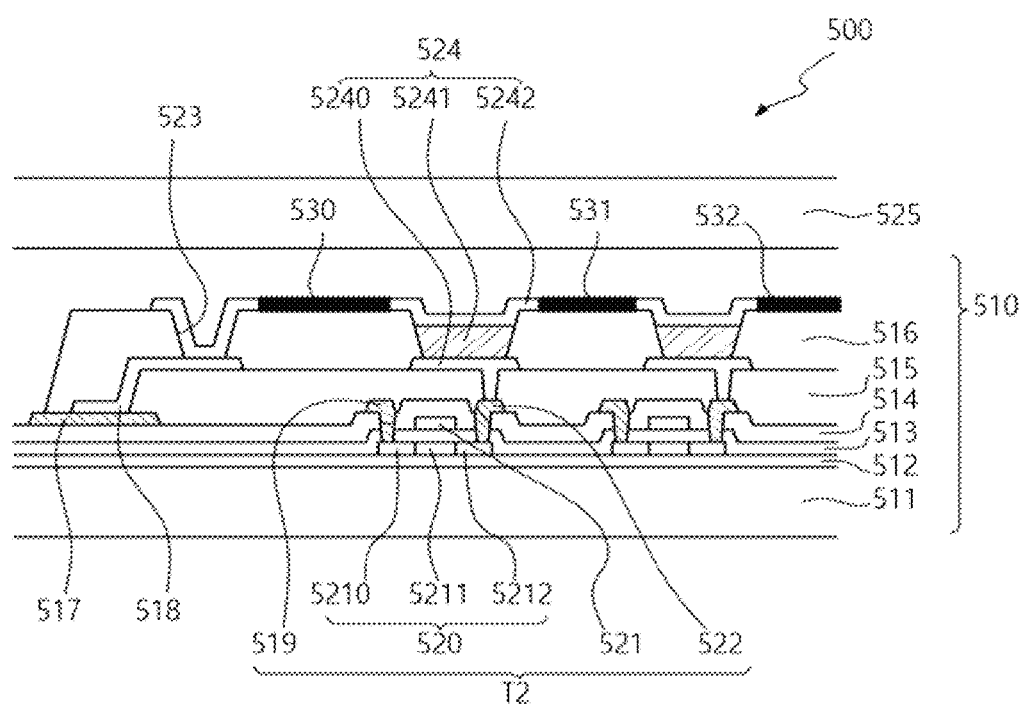

[FIG 6]
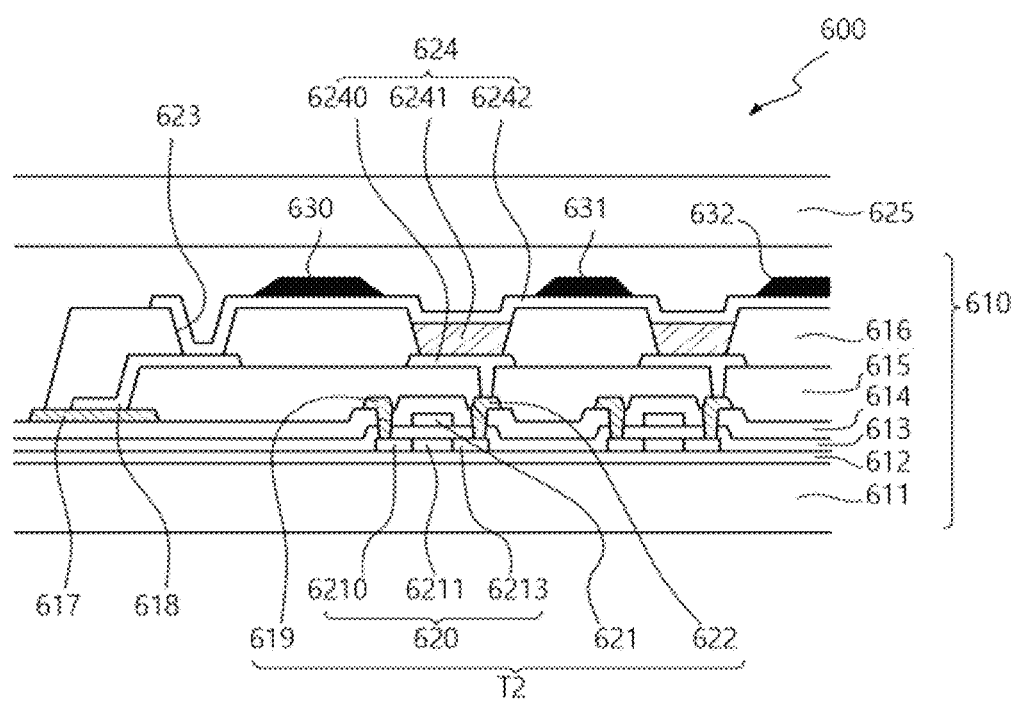

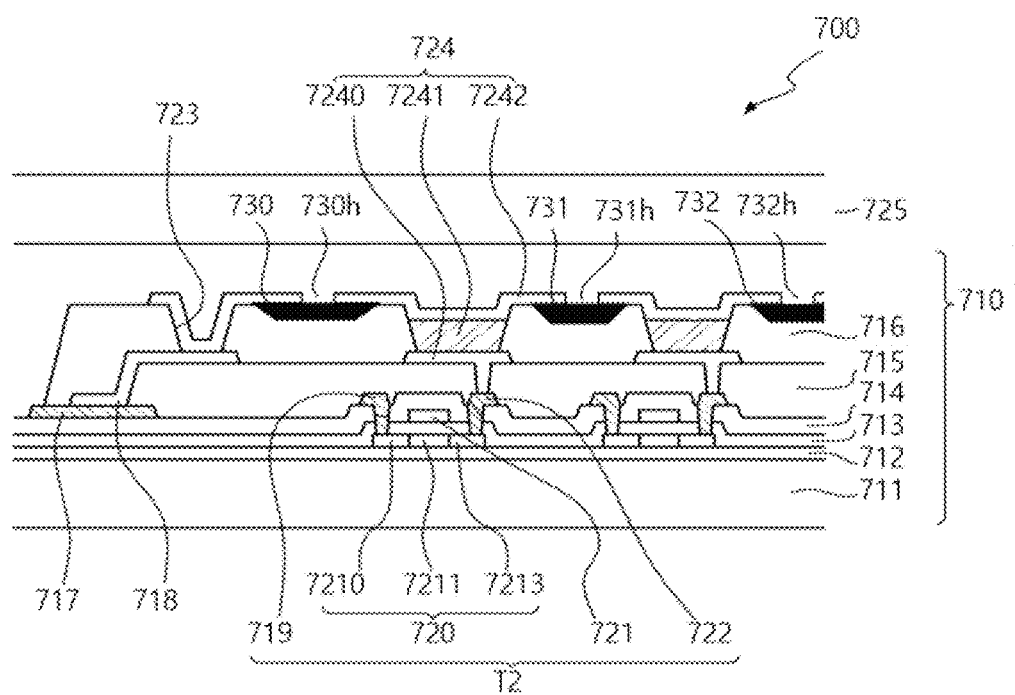
[FIG 7]

[FIG 8]
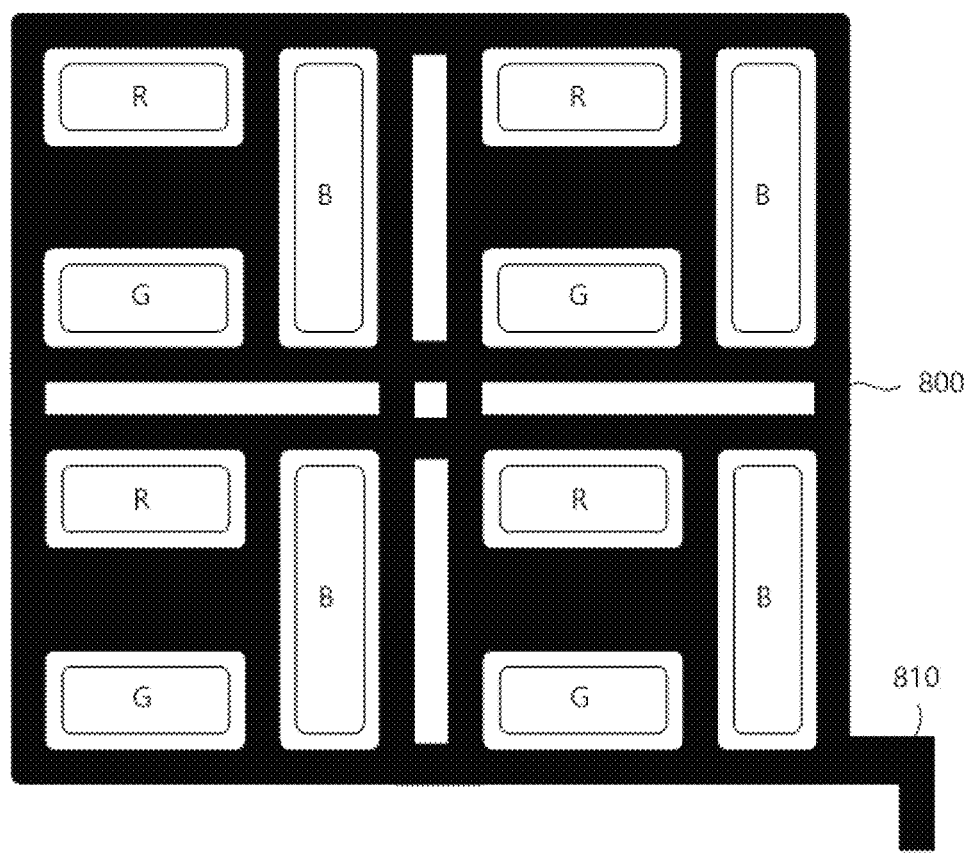

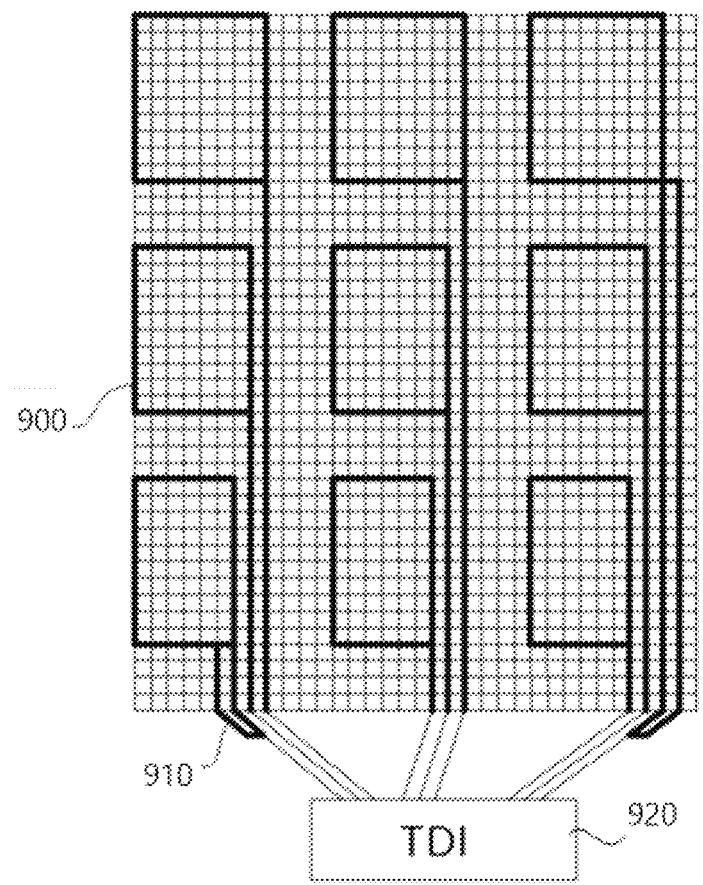
[FIG 9]

[FIG 10]
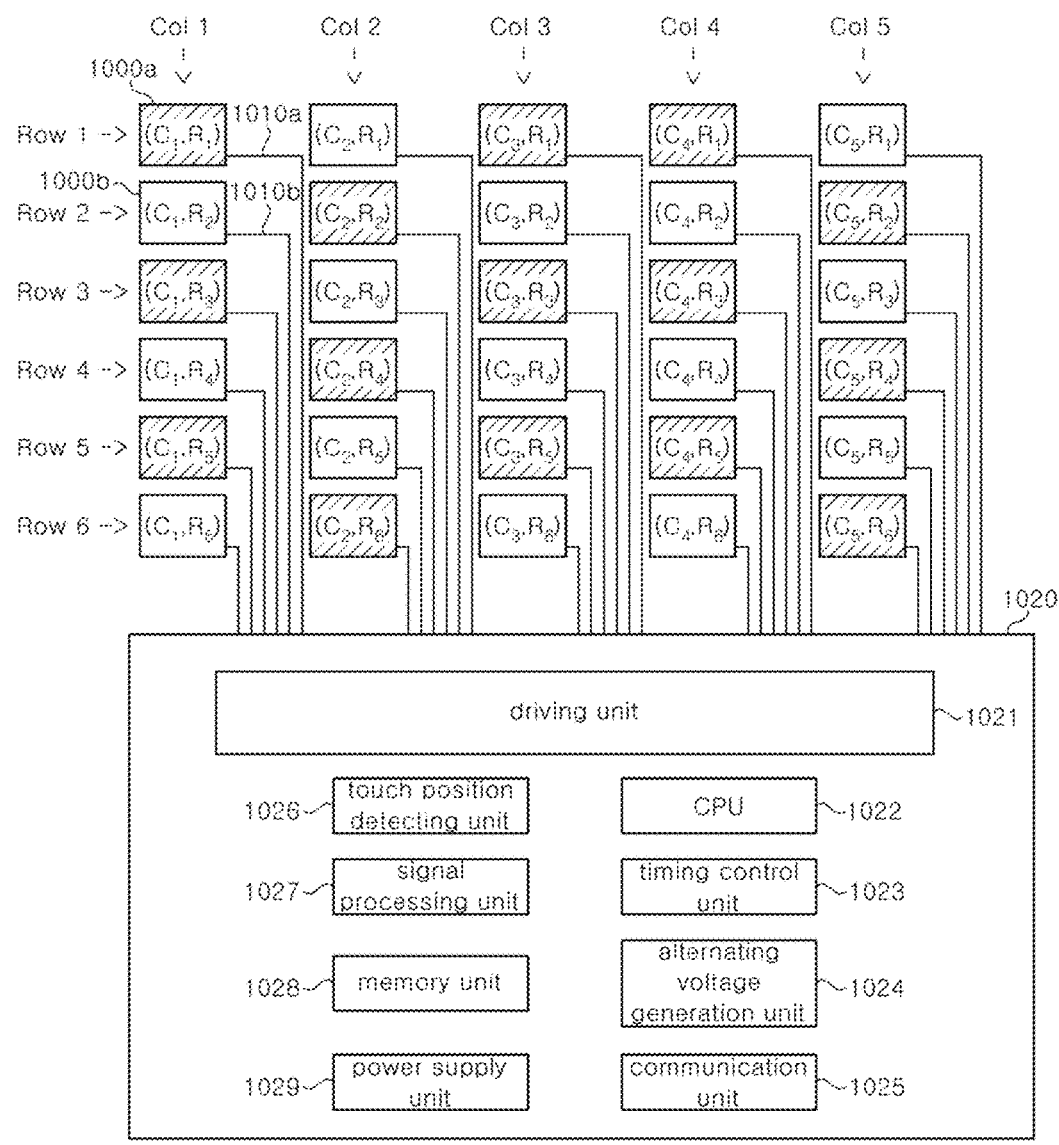

[FIG 11]
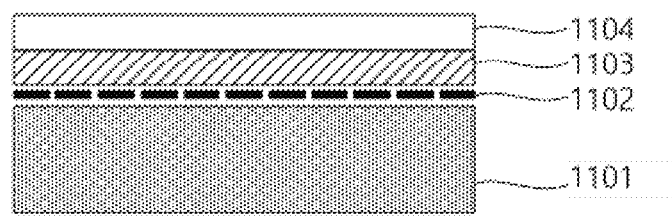
[FIG 12]
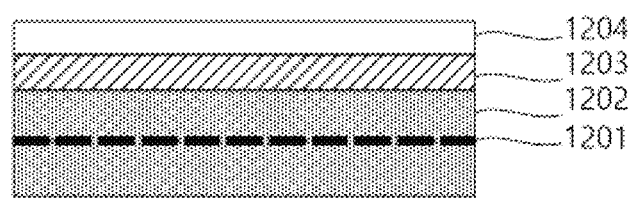

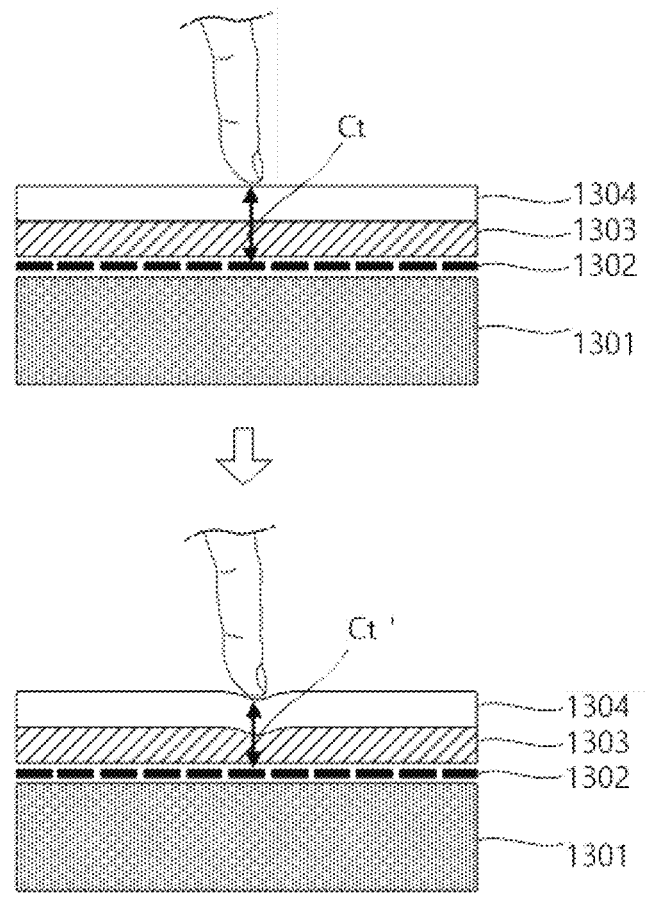
[FIG 13]

[FIG 14]
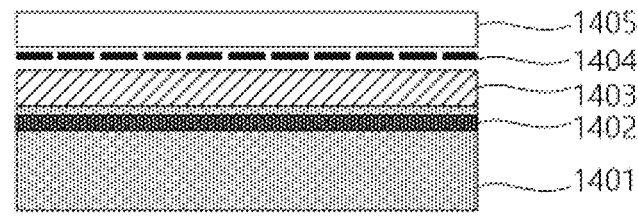
[FIG 15]
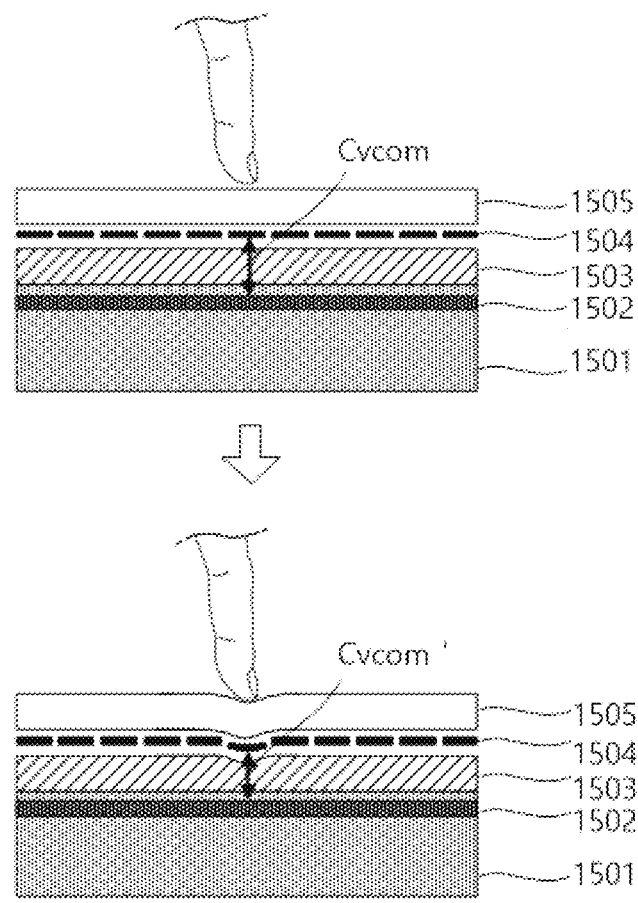

[FIG 16]
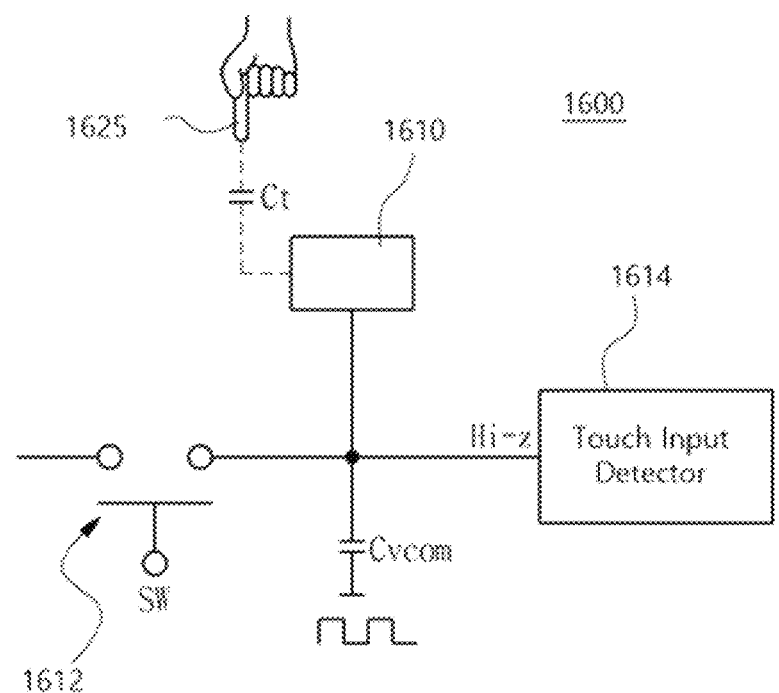

[FIG 17]
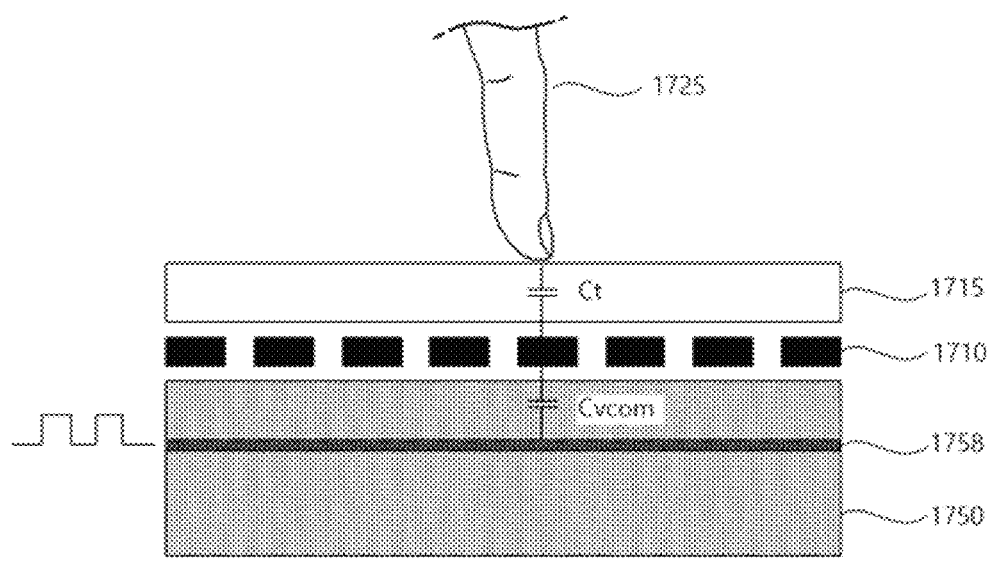

[FIG 18]
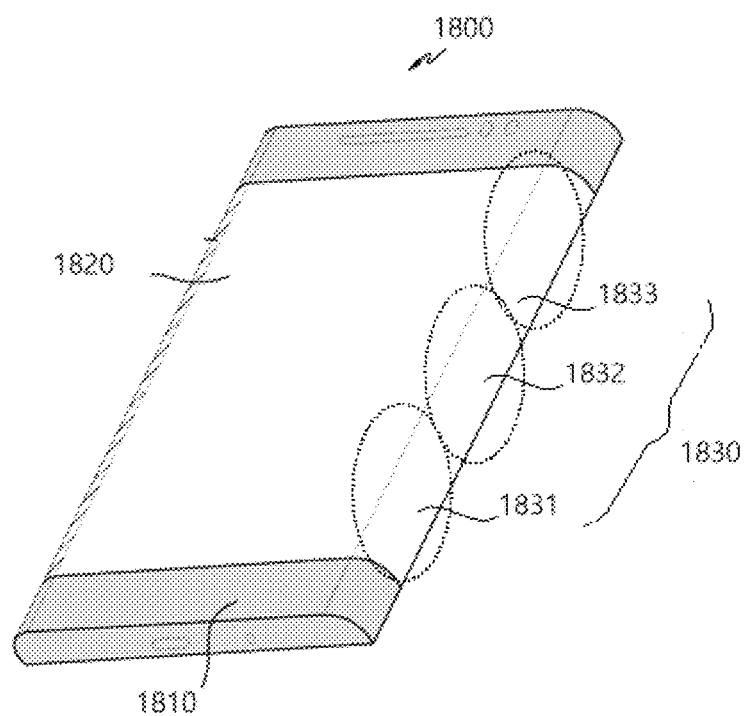

[FIG 19]
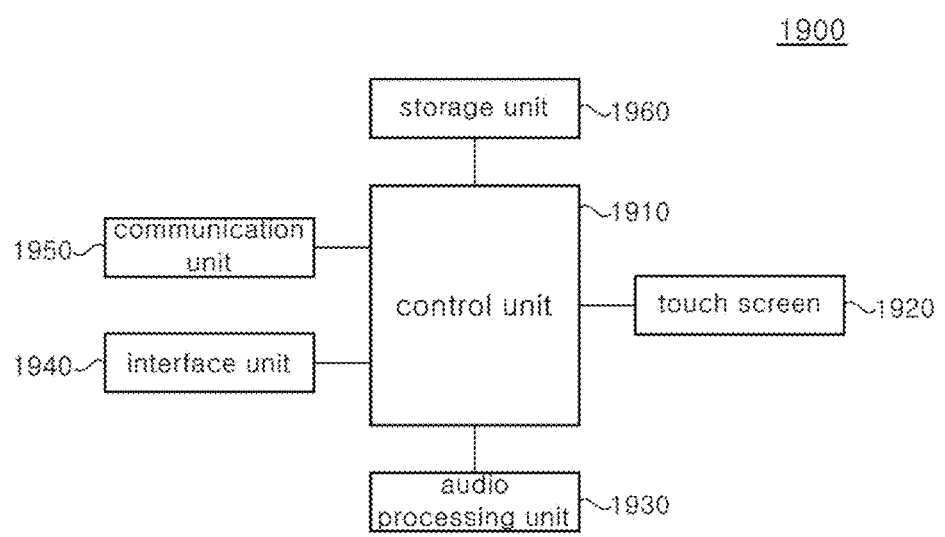

DISPLAY DEVICE INCLUDING TOUCH SCREEN

CROSS-REFERENCE TO RELATED APPLICATIONS

This application claims priority to and the benefit of Korean Patent Application No. 10-2016-0171404 filed in the Korean Intellectual Property Office on Dec. 15, 2016, the entire contents of which are incorporated herein by reference.

TECHNICAL FIELD

The present invention relates to a display device including a touch screen.

BACKGROUND ART

In general, a touch screen is used in a mobile device, such as a mobile phone, a personal digital assistant (PDA), and a portable multimedia player (PMP), and various industrial fields, such as a navigation device, a netbook computer, a notebook computer, a digital information device (DID), a desktop computer using a touch input support operating system, an Internet protocol TV (IPTV), and high-tech fighter, tank, and armed car.

The touch screen may be added onto various types of display devices, such as a liquid crystal display (LCD), a plasma display panel (PDP), and an organic light emitting diode (OLED), or may be embedded inside the display device.

The OLED is an autonomous light emitting display device, in which electrons and holes injected to an organic material thin film through an anode and a cathode are re-combined to form exciton and which generates light of a specific wavelength by energy of the exciton. The OLED may be divided into an active matrix organic light emitting diode (AMOLED), a passive matrix organic light emitting diode (PMOLED), and the like.

The display device using the touch screen may be divided into a touch screen add-on type display device, a touch screen on-cell type display device, a touch screen in-cell type display device, and the like.

The touch screen add-on type display device adopts a scheme, in which a display device and a touch screen are separately manufactured, and then the touch screen is attached on an upper plate of the display device, and has a disadvantage in that a thickness thereof is large and brightness thereof is low to degrade visibility.

The touch screen on-cell type display device adopts a scheme, in which elements constituting the touch screen are directly formed on an upper substrate of a display device, for example, a surface of a color filter of an LCD or a surface of a sealed substrate of the OLED, and may have a decreased thickness than that of the touch screen add-on type display device, but still has a limit in decreasing a thickness.

SUMMARY OF THE INVENTION

The present invention has been made in an effort to provide, for example, a display device including a touch screen, which performs a predetermined specific operation corresponding to a pressure touch when the pressure touch is detected in a specific region corresponding to an outer portion of a touch screen, thereby improving user convenience.

The present invention has also been made in an effort to provide, for example, a display device including a touch screen, in which a touch sensor and a sensor line are formed in a mesh pattern in a partial region of a common electrode that applies a common voltage to an organic light emitting body, thereby efficiently decreasing a thickness of the device in an organic light emitting display device.

The present invention has also been made in an effort to provide, for example, a display device including a touch screen, in which a touch sensor and a sensor line are formed in a mesh pattern at an upper side or a lower side of a partial region of a common electrode that applies a common voltage to an organic light emitting body, thereby efficiently decreasing a thickness of the device in an organic light emitting display device.

An exemplary embodiment of the present invention provides an organic light emitting diode (OLED) display device including a touch screen, the OLED display device including: a plurality of pixels including organic light emitting bodies; and a common electrode which applies a common voltage to the organic light emitting body, in which a plurality of touch sensors and a plurality of sensor lines are formed in a mesh pattern in a partial region of the common electrode corresponding to a boundary region between the organic light emitting bodies.

Another exemplary embodiment of the present invention provides an organic light emitting diode (OLED) display device including a touch screen, the OLED display device including: a plurality of pixels including organic light emitting bodies; and a common electrode which applies a common voltage to the organic light emitting body, in which touch sensors and sensor lines are formed in a mesh pattern at an upper side of a partial region of the common electrode corresponding to a boundary region between the organic emitting bodies.

Still another exemplary embodiment of the present invention provides an Organic light emitting diode (OLED) display device including a touch screen, the OLED display device including: a plurality of pixels including organic light emitting bodies; and a common electrode which applies a common voltage to the organic light emitting body, in which touch sensors and sensor lines are formed in a mesh pattern at a lower side of a partial region of the common electrode corresponding to a boundary region between the organic emitting bodies, and a through hole for detecting a touch may be formed in a partial region of the common electrode.

The OLED may be an active matrix organic light emitting diode (AMOLED) or a passive matrix organic light emitting diode (PMOLED). The boundary region between the organic emitting bodies and the partial region of the common electrode may be vertically positioned on the same line. The plurality of touch sensors and the plurality of sensor lines may be formed by one mask with the common electrode.

The plurality of touch sensors may be divided into sensing pads which detect a touch and non-sensing pads which do not detect a touch by a sequential scheme which follows a predetermined order. The plurality of touch sensors and the plurality of sensor lines may be a transparent conductive material or a non-transmitting metal material.

The plurality of touch sensors and the plurality of sensor lines may be vertically positioned on the same line with a source line or a gate line driving the pixel. The plurality of touch sensors may be disposed in a dot matrix structure, and the plurality of touch sensors may have a different area according to a spacing distance between the touch sensor and a touch drive IC.

According to the exemplary embodiments of the present invention, it is possible to rapidly and conveniently perform a predetermined specific operation, such as a volume control, a power control, or a reset operation, by inputting, by a user, a touch with pressure in a specific region corresponding to an outer portion of a touch screen.

According to the exemplary embodiments of the present invention, it is possible to efficiently decrease a thickness of a display device including a touch screen and further simplify a manufacturing process, thereby contributing to decreasing product prices and improving productivity.

According to the exemplary embodiments of the present invention, it is possible to prevent a touch sensor and a sensor line from being observed in a display device including a touch screen, and remove or decrease an influence of the touch sensor and the sensor line on the display device.

According to the exemplary embodiments of the present invention, it is possible to prevent an error of recognition of a touch signal, decrease stray capacitance generated between a touch sensor or a sensor line and constituent elements of a display device, or decrease resistance of the sensor line.

BRIEF DESCRIPTION OF THE DRAWINGS

FIG. 1 is a diagram illustrating a structure of an organic light emitting diode to which an exemplary embodiment of the present invention is applied.

FIG. 2 is an equivalent circuit diagram illustrating a pixel of an organic light emitting display device to which an exemplary embodiment of the present invention is applied.

FIG. 3 is a layout view of the pixel of the organic light emitting display device to which the exemplary embodiment of the present invention is applied.

FIG. 4 is an enlarged cross-sectional view of portion A-A' of FIG. 3.

FIG. 5 is a cross-sectional view illustrating the case where a touch sensor and a sensor line are formed in a partial region of a common electrode according to a first exemplary embodiment of the present invention.

FIG. 6 is a cross-sectional view illustrating the case where a touch sensor and a sensor line are formed at an upper side of a partial region of a common electrode according to a second exemplary embodiment of the present invention.

FIG. 7 is a cross-sectional view illustrating the case where a touch sensor and a sensor line are formed at a lower side of a partial region of a common electrode according to a third exemplary embodiment of the present invention.

FIG. 8 is a diagram illustrating an example in which a touch sensor and a sensor line are formed in a mesh pattern in a boundary region between pixels according to the exemplary embodiment of the present invention.

FIG. 9 is a diagram illustrating an example in which a touch sensor is connected with a touch detecting unit through a sensor line according to an exemplary embodiment of the present invention.

FIG. 10 is a diagram illustrating an example in which touch sensors are alternately operated as a sensing pad and a non-sensing pad according to the exemplary embodiment of the present invention.

FIGS. 11 and 12 are diagrams illustrating an example in which a touch layer detecting a pressure touch and an elastic member are installed according to an exemplary embodiment of the present invention.

FIG. 13 is a diagram illustrating an example in which a pressure touch of touch capacitance Ct is detected according to an exemplary embodiment of the present invention.

FIG. 14 is a diagram illustrating an example in which a touch layer detecting a pressure touch, an elastic member, and a common electrode are installed according to an exemplary embodiment of the present invention.

FIG. 15 is a diagram illustrating an example in which a pressure touch of common voltage capacitance Cvcom is detected according to an exemplary embodiment of the present invention.

FIG. 16 is a diagram illustrating an example of a touch detecting circuit diagram according to an exemplary embodiment of the present invention.

FIG. 17 is a cross-sectional view illustrating an example of a basic configuration in which touch capacitance and common voltage capacitance are detected according to an exemplary embodiment of the present invention.

FIG. 18 is a diagram illustrating an example in which a touch screen is divided into a first region and a second region according to an exemplary embodiment of the present invention.

FIG. 19 is a circuit diagram of a portable terminal to which the exemplary embodiment of the present invention is applied.

DETAILED DESCRIPTION

Hereinafter, various exemplary embodiments of the present invention will be described in detail with reference to the accompanying drawings.

The present invention relates to a display device including a touch screen, and a display device to which an exemplary embodiment of the present invention is applied may be a display device, such as a liquid crystal diode (LCD), various types of organic light emitting diode (OLED) display devices, such as an active matrix organic light-emitting diode (AMOLED) or a passive matrix organic light-emitting diode (PMOLED), or various types of display devices displaying a predetermined form of a still image (for example, joint photographic experts group (JPG), tagged image file (TIF), and the like) or a video (for example, motion picture experts group (MPEG)-2, MPEG-4, and the like).

A method of detecting a touch of the exemplary embodiment of the present invention may compare a size of a voltage detected when a touch is not generated with a size of a voltage detected when touch capacitance is added by a generation of a touch and detect a touch based on a difference in a size between the two voltages. Further, it is possible to more stably obtain a touch signal by minimizing an influence from stray capacitance and the like by a guard layer G/L.

A touch input means of the exemplary embodiment of the present invention may include, for example, a keyboard, a mouse, a finger, a touch pen, and a stylus pen, and various forms of input means, for example, an object, such as a conductor having a predetermined form, or an input means generating an electromagnetic wave and the like, incurring a voltage change to be sensed by a touch sensor.

The touch sensor of the exemplary embodiment of the present invention may be referred while being divided into, for example, a sensing pad and a non-sensing pad. The sensing pad means a touch sensor which is connected to a touch detecting unit so as to detect a touch among the plurality of touch sensors, and the non-sensing pad means a touch sensor which is not connected to the touch detecting unit so as not to detect a touch among the plurality of touch sensors. The sensing pad and the non-sensing pad may be changed from each other in a predetermined order, for example, by a sequential scheme that follows a predetermined order or a time sharing scheme.

A term "on the same line" among the terms and the expressions mentioned in the exemplary embodiment of the present invention may be used as a meaning where elements opposite or overlap at the same upper and lower positions and a metal material, an insulator, and the like forming a signal line and the like may be present on the same line. For example, "A and B are present on the same line" means that A is present on an upper surface of B or B is present on an upper surface of A, and another material, such as an insulator or a metal, may be present between A and B. Further, when A and B are present on the same line, a width of A and a width of B are not limited unless explicitly described to the contrary, and a ratio of the widths of A and B is not specified unless explicitly described to the contrary.

Constituent elements, such as "~ unit" among the terms and the expressions mentioned in the exemplary embodiment of the present invention are aggregation of unit function elements performing a specific function, and for example, an amplifier of a specific signal is a unit function element and an aggregation of amplifiers or signal converters may be referred to as a signal converting unit and the like. Further, "~ unit" may be included in a larger constituent element or a "~ unit", or may include smaller constituent elements and "~ units". Further, "~ unit" may include an own central processing unit (CPU) which is capable of autonomously processing a calculation function, a command stored in a memory and the like, and the like.

In the drawings of the exemplary embodiment of the present invention, the thickness or the regions of layers and regions are exaggerated for clarity, and like reference numerals designate like elements. It will be understood that when a part of a layer, a region, or a substrate is referred to as being "on" another element or "on an upper surface" of another element, it can be directly on another element (there is no other intervening element) or another intervening element (for example, a medium layer or an insulating layer) may also be present.

A signal mentioned in the exemplary embodiment of the present invention may collectively refer to voltage or current unless explicitly specified otherwise, and capacitance may represent a physical size and may be used as the same meaning as that of electrostatic capacity. A capacitor may refer to an element having a physical size or capacitance. In the exemplary embodiment of the present invention, a compensation capacitor Cbal may be generated by a design and manufacturing process inside a touch detecting unit, for example, a touch drive integrated circuit (IC), and may be naturally generated between two adjacent sensor lines. In the exemplary embodiment of the present invention, the directly generated capacitor and the naturally generated capacitor are all referred to as a capacitor without discrimination.

In the exemplary embodiment of the present invention, a symbol "C" used as a symbol of the capacitor is used as a symbol denoting a capacitor, and may represent capacitance that is a size of a capacitor. For example, C1 may be a symbol denoting a capacitor and may mean that capacitance that is a size of a capacitor is C1.

In the exemplary embodiment of the present invention, an expression "forcing a signal" may mean changing a level of a signal which is maintained in a specific state. For example, an expression "a signal is forced to an on/off control terminal of a switching device" may mean that a low level voltage (for example, a voltage to ground (zero volt) or a DC voltage and an AC voltage having a predetermined voltage) is changed to a high level (for example, a DC voltage or an AC voltage having a larger amplitude value than that of a low level voltage).

In the exemplary embodiment of the present invention, expressions a "a detection of a touch or a touch signal" may have the same meaning, and a representative exemplary embodiment of the detection of the touch signal may be the case where a difference between a first voltage which is detected by a touch detecting unit when a conductor, such as a finger, does not contact or approach a touch sensor and thus capacitance is not formed, and a second voltage which is detected by a touch detecting unit by touch capacitance Ct formed when a conductor, such as a finger, contacts or approaches a touch sensor is detected.

In the exemplary embodiment of the present invention, a touch detecting unit may be referred to as, for example, a touch drive IC, and the touch drive IC may be abbreviated to a touch IC or a TDI. In the exemplary embodiment of the present invention, the terms, precharge and charge may be used in the same meanings as a precharge voltage and a charge voltage, and a sensing pad may have a meaning including a sensing pad and sensor lines connected to the sensing pad, and a non-sensing pad may have a meaning including a non-sensing pad and sensor lines connected to the non-sensing pad unless explicitly specified otherwise.

In the exemplary embodiment of the present invention, a source signal line (source line) and a gate signal line (gate line) may be referred to as driving signal lines, and the driving signal line may collectively refer to the gate line and the source line, and may refer to any one of the source line and the gate line. Further, in the exemplary embodiment of the present invention, a sub pixel may also be referred to as a pixel.

In the exemplary embodiment of the present invention, the touch sensor and the sensor line are disposed inside an OLED display device, so that a structure of the OLED display device needs to be inspected in detail. Hereinafter, various exemplary embodiments of the present invention will be described in detail based on an AMOLED. However, concepts of a pixel, a signal line, and a common electrode are also included in various kinds of display devices, such as a PMOLED, so that a technical spirit of the present invention in which a touch screen is embedded based on a pixel, a signal line, and a common electrode, may be applied.

FIG. 1 is a diagram illustrating a structure of an organic light emitting diode to which an exemplary embodiment of the present invention is applied. Referring to FIG. 1, for example, an AMOLED 100 has a sandwich structure in which an organic thin film layer 120 is surrounded by an anode 130 and a cathode 110. The organic thin film layer 120 is formed of an electron injection layer (EIL) 121, an electron transfer layer (ETL) 122, an emission material layer (EML) 123, a hole transport layer (HTL) 124, and a hole injection layer (HIL) 125.

The EML 123 needs to emit light to the outside, so that a light transmitting transparent electrode, for example, a transparent electrode including an indium tin oxide (ITO), may be used. When a DC voltage is applied to the anode 130 and the cathode 110, holes (+) generated in a boundary between the anode 130 and the cathode 110 and the organic thin film layer 120 head the HTL 124 in the anode 130, and electrons (−) move to the anode 130 through the ETL 122.

The holes and electrons moved as described above are combined with one another in the EML 123, and electron energy is changed from a stable ground state to an unstable exciton state having high energy by the combination, and then is changed to the stable ground state again. In this case, the characteristic that energy corresponding to a difference between two energy levels is emitted as light at a time of the change from the exciton state to the ground state is a basic principle of the light emission of the AMOLED.

FIG. 2 is an equivalent circuit diagram illustrating a pixel of an organic light emitting display device to which the exemplary embodiment of the present invention is applied. Referring to FIG. 2, for example, a pixel PX of an AMOLED 200 may be connected with a plurality of signal lines 210, 220, and 230, and may be approximately arranged in a matrix form.

The plurality of signal lines 210, 220, and 230 may be divided into the plurality of scan lines 210 transmitting a scan signal or a gate signal, the plurality of data lines 220 transmitting a data signal, and the plurality of driving voltage lines 230 transmitting a driving voltage ELVDD. The scan lines 210 are extended almost in parallel to one another in a row direction, and the data lines 220 and the driving voltage lines 230 are extended almost in parallel to one another in a column direction.

The pixel PX may include a switching thin film transistor T1, a driving thin film transistor T2, a storage capacitor Cst, and an organic light emitting diode OLED.

The switching thin film transistor T1 may have a control terminal, an input terminal, and an output terminal, and the control terminal may be connected to the scan line 210, the input terminal may be connected to the data line 220, and the output terminal may be connected to the driving thin film transistor T2. The switching thin film transistor T1 transmits a data signal applied to the data line 220 to the driving thin film transistor T2 in response to a scan signal applied to the scan line 210.

The driving thin film transistor T2 may have a control terminal, an input terminal, and an output terminal, and the control terminal may be connected to the switching thin film transistor T1, the input terminal may be connected to the driving voltage line 230, and the output terminal may be connected to the organic light emitting diode OLED. The driving thin film transistor T2 may transmit an output current Id of which a size is changed according to a voltage applied between the control terminal and the output terminal to the organic light emitting diode OLED.

The storage capacitor Cst may be connected between the control terminal and the input terminal of the driving thin film transistor T2, and may charge a data signal applied to the control terminal of the driving thin film transistor T2 and maintain the data signal even when the switching thin film transistor T1 is turned off.

The organic light emitting diode OLED includes an anode connected to the output terminal of the driving thin film transistor T2 and a cathode connected to a common voltage ELVSS, and emits light while changing an intensity according to the output current Id of the driving thin film transistor T2 to display an image.

The switching thin film transistor T1 and the driving thin film transistor T2 may be an n-channel field effect transistor (FET) or a p-channel FET. Herein, a connection relationship among the switching thin film transistor T1, the driving thin film transistor T2, the storage capacitor Cst, and the organic light emitting diode OLED may be changed.

FIG. 3 is a layout view of the pixel of the organic light emitting display device to which the exemplary embodiment of the present invention is applied. Referring to FIG. 3, for example, the pixels of the AMOLED are organic light emitting diodes which autonomously emit light with various colors, R, G, and B, and may be approximately disposed in a matrix form.

The organic light emitting diode may include a pixel electrode, an organic emission layer, and a common electrode, and the pixel electrode 300 for applying a driving voltage ELVDD may be formed at a lower side of the organic emission layer, and the common voltage for applying a common voltage ELVSS may be formed at an upper side of the organic emission layer. Herein, the pixel electrode may correspond to the anode of the organic light emitting diode and the common electrode may correspond to the cathode of the organic light emitting diode.

As the pixel electrode 300 and the common electrode, for example, a transparent conductive material, such as an ITO, an indium zinc oxide (IZO), a ZnO, or an indium oxide ($In_2O_3$), or a non-transmitting metal material, such as lithium (Li), calcium (Ca), lithium/calcium fluoride (LiF/Ca), lithium/aluminum fluoride (LiF/Al), aluminum (Al), silver (Ag), magnesium (Mg), or gold (Au) may be used.

FIG. 4 is a cross-sectional view of the organic light emitting display device to which the exemplary embodiment of the present invention is applied, for example, an enlarged cross-sectional view of portion A-A' of FIG. 3. Referring to FIG. 4, the organic light emitting display device 400 includes an emission display substrate 410 and a sealing substrate 425, and the emission display substrate 410 has a structure in which a lower substrate 411, a buffer layer 412, a gate insulating layer 413, an interlayer insulating layer 414, a passivation layer 415, a pixel defining layer 416, and the like are stacked.

The emission display substrate 410 includes an organic light emitting diode 425, the driving thin film transistor T2, a switching thin film transistor (not illustrated), and the like, the organic light emitting diode 424 includes a pixel electrode 4240, an organic emission layer 4241, and a common electrode 4242. The driving thin film transistor T2 includes a driving source electrode 419, a driving semiconductor layer 420, a driving gate layer 421, and a driving drain electrode 422, and the driving semiconductor layer 420 may be divided into a source region 4210, a channel region 4211, and a drain region 4212.

The emission display substrate 410 includes a common voltage line 417, a connection line 418, and a contact hole 423. The common voltage line 417 is formed along a peripheral region surrounding a pixel area, the connection line 418 is formed in the peripheral region and is in direct contact with the common voltage line, and the contact hole 423 is formed in the peripheral region and makes the connection line 418 be in contact with the common electrode 4242.

The lower substrate 411 may be an insulated substrate formed of glass, quartz, ceramic, or plastic. The buffer layer 412 may be formed in a single layer of a silicon nitride (SiNx) or in a dual layer structure in which a silicon nitride (SiNx) and a silicon oxide ($SiO_2$) are stacked, and the buffer layer 412 may prevent unnecessary ingredients, such as impurities or moisture, from permeating and make a surface be flat.

The driving semiconductor layer 420 may be formed of poly silicon or a semiconductor oxide, and for example, when the driving semiconductor layer 420 is formed of a semiconductor oxide, a passivation layer may be added for protecting the semiconductor oxide which is vulnerable to an external environment, such as a high temperature.

The gate insulating layer 413 may be formed on the driving semiconductor layer 420 and may have a single layer or multiple layers including at least one of a silicon nitride and a silicon oxide, and a scan line, a driving gate electrode, a storage capacitor, and the like may be formed on the gate insulating layer 413.

The interlayer insulating layer 414 may be formed on the scan line, the driving gate electrode, and the storage capacitor, and similar to the gate insulating layer, the interlayer insulating layer may be formed of a silicon nitride or a silicon oxide. The passivation layer 415 is formed at an upper side of the interlayer insulating layer, and the pixel electrode 4240, the connection line 418, and the like are formed at the upper side of the passivation layer 415.

The pixel defining layer 416 is formed at border portions of the passivation layer 415 and the pixel electrode 4240, and has an opening (not illustrated) which exposes the pixel electrode 4240 and the contact hole 423 which makes the connection line 418 be in contact with the common electrode. The pixel defining layer 416 may be formed of resin, such as polyacrylates or polyimides, a silica-based inorganic material, and the like.

In the meantime, as illustrated in FIG. 4, a region referred to as a black matrix (BM) is present in a boundary region between the organic emission layers 4241. Herein, the black matrix region may be referred to as a BM region or other predetermined names.

In various exemplary embodiments of the present invention, the touch sensor and the sensor line are formed in a mesh pattern in a partial region of the common electrode 4242 corresponding to the BM region, or the touch sensor and the sensor line are formed in a mesh pattern at the upper side or the lower side of a partial region of the common electrode 4242 corresponding to the BM region, thereby providing a display device including a touch screen in which a thickness of the device may be efficiently decreased. Hereinafter, this will be described in detail.

FIG. 5 is a cross-sectional view illustrating the case where a touch sensor and a sensor line are formed in a partial region of a common electrode according to a first exemplary embodiment of the present invention.

Referring to FIG. 5, a display device 500 including a touch screen according to a first exemplary embodiment of the present invention has a structure which is identical or almost similar to that described with reference to FIG. 4, and a touch sensor and a sensor line may be formed in a mesh pattern in a partial region of a common electrode 5242 which applies a common voltage to an organic emission layer (or an organic emission body) 5241.

For example, as illustrated in FIG. 5, the touch sensor for detecting a touch and the sensor line are formed in mesh patterns 530, 531, and 532 of a transparent conductive material or a non-transmitting metal material in a partial region of the common electrode 5242 corresponding to the BM region, thereby efficiently decreasing a thickness of the display device.

FIG. 6 is a cross-sectional view illustrating the case where a touch sensor and a sensor line are formed at an upper side of a partial region of a common electrode according to a second exemplary embodiment of the present invention.

Referring to FIG. 6, a display device 600 including a touch screen according to a second exemplary embodiment of the present invention has a structure which is identical or almost similar to that described with reference to FIG. 4, and a touch sensor and a sensor line may be formed in a mesh pattern at an upper side of a partial region of a common electrode 6242 which applies a common voltage to an organic emission layer (or an organic emission body) 6241.

For example, as illustrated in FIG. 6, the touch sensor for detecting a touch and the sensor line are formed in mesh patterns 630, 631, and 632 of a transparent conductive material or a non-transmitting metal material at an upper side of a partial region of the common electrode 6242 corresponding to the BM region, thereby efficiently decreasing a thickness of the display device.

FIG. 7 is a cross-sectional view illustrating the case where a touch sensor and a sensor line are formed at a lower side of a partial region of a common electrode according to a third exemplary embodiment of the present invention.

Referring to FIG. 7, a display device 700 including a touch screen according to a third exemplary embodiment of the present invention has a structure which is identical or almost similar to that described with reference to FIG. 4, and a touch sensor and a sensor line may be formed in a mesh pattern at a lower side of a partial region of a common electrode 7242 which applies a common voltage to an organic emission layer (or an organic emission body) 7241.

For example, as illustrated in FIG. 7, the touch sensor for detecting a touch and the sensor line are formed in mesh patterns 730, 731, and 732 of a transparent conductive material or a non-transmitting metal material at a lower side of a partial region of the common electrode 7242 corresponding to the BM region, thereby efficiently decreasing a thickness of the display device. Herein, through holes 730*h*, 731*h*, and 732*h* for securing sensitivity of a touch detection may be formed in partial regions of the common electrodes corresponding to the regions in which the mesh patterns 730, 731, and 732 are formed.

FIG. 8 is a diagram illustrating an example in which a touch sensor and a sensor line are formed in a mesh pattern in a boundary region between pixels according to the exemplary embodiment of the present invention.

As described above with reference to FIGS. 5 to 7, the touch sensor and the sensor line in the mesh pattern may be formed in the partial region of the common electrode corresponding to the BM region or may be formed at the upper side or the lower side of the partial region of the common electrode corresponding to the BM region based on the BM region that is the boundary region between the pixels (for example, the organic emission layers).

Referring to FIG. 8, one touch sensor 800 may be set by grouping the mesh patterns corresponding to the plurality of pixels, and one sensor line 810 may be connected to the one touch sensor 800.

Two or more sensor lines may be connected to the one touch sensor 800 for the purpose of enabling a touch detection to be normally performed by another sensor line even though one predetermined sensor line is disconnected.

The one touch sensor 800 may be set in a mesh pattern corresponding to, for example, one pixel or a few pixels (for example, two pixels) for implementing the touch sensor in which high resolution is required, for fingerprint recognition and the like.

Herein, the number of pixels corresponding to the touch sensors and the number of sensor lines connected to the touch sensor are not limited by the exemplary embodiment of the present invention.

FIG. 9 is a diagram illustrating an example in which a touch sensor is connected with a touch detecting unit through a sensor line according to an exemplary embodiment of the present invention.

Referring to FIG. 9, for example, one touch sensor 900 may be set by grouping mesh patterns corresponding to the plurality of pixels, and the touch sensor 900 may be connected to one sensor line to be connected with a touch detecting unit 920. Further, as illustrated in FIG. 9, one or more touch sensors may be connected with several (for example, two) sensor lines 910 to be connected with the touch detecting unit 920.

The touch detecting unit 920 may be variously referred to as, for example, a touch drive IC or a TDI. The touch detecting unit 920 is a circuit element which drives the touch sensor, receives a touch signal through the sensor line, and detects a position, an area, or the like of a touch input.

For example, the touch detecting unit 920 may be separately installed from a display drive IC which drives an organic light emitting display device and linked with the display drive IC or integrally designed as one IC with the display drive IC.

Herein, an area of the touch sensor 900 may be differently set according to a spacing distance from the touch detecting unit 920. For example, an area of the touch sensor far from the touch detecting unit 920 may be set to be larger than an area of the touch sensor close to the touch detecting unit 920.

Further, a width of the sensor line 910 may be differently set according to a connection length with the touch detecting unit 920. For example, a width of the sensor line having a large connection length with the touch detecting unit 920 may be set to be larger than a width of the sensor line having a small connection length with the touch detecting unit 920.

FIG. 10 is a diagram illustrating an example in which touch sensors are alternately operated as a sensing pad and a non-sensing pad according to the exemplary embodiment of the present invention.

Referring to FIG. 10, as described above with reference to FIGS. 8 and 9, the plurality of touch sensors formed in the mesh pattern may be arranged with the plurality of rows (for example, Row1 to Row6) to the plurality of columns (for example, Col1 to Col5) in a dot matrix form. Some of the touch sensors may be varied and set to sensing pads 1000a which perform a touch detection, and other touch sensors may be varied and set to non-sensing pads 1000b which do not perform a touch detection.

Herein, the sensing pad 1000a and the non-sensing pad 1000b are terms symbolically expressing a current operation state of the touch sensor, and may be referred to as other predetermined names. The sensing pad 1000a and the non-sensing pad 1000b may be alternated under the control of the touch detecting unit 1020. For example, the touch detecting unit 1020 may alternate one touch sensor as the sensing pad and the non-sensing pad by using a time sharing scheme.

The touch detecting unit 1020 may be the touch drive IC (TDI) as described above, or a circuit element, for example, a touch display drive IC (TDDI), integrated with the display drive IC into one unit.

As illustrated in FIG. 10, the touch detecting unit 1020 may include a driving unit 1021, a CPU 1022, a timing control unit 1023, an alternate voltage generating unit 1024, a communication unit 1025, a touch position detecting unit 1026, a signal processing unit 1027, a memory unit 1028, and a power supply unit 1029. Herein, one or more constituent elements (for example, the CPU and the power supply unit) of among the constituent elements may be installed outside the touch detecting unit 1020.

The driving unit 1021 may be linked with the timing control unit 1023 to vary and set one touch sensor to the sensing pad and the non-sensing pad, and in this case, the time sharing scheme may be used.

For example, as illustrated in FIG. 10, among the plurality of touch sensors arranged in a dot matrix form, first to six touch sensors arranged in a first column Col1 may be varied and set to the sensing pads (C1, R1), (C1, R3), and (C1, R5) and the non-sensing pads (C1, R2), (C1, R4), and (C1, R6) with an interval of one touch sensor, and first to six touch sensors arranged in a second column Col2 may be varied and set to the sensing pads (C2, R2), (C2, R4), and (C2, R6) and the non-sensing pads (C2, R1), (C2, R3), and (C2, R5) with an interval of one touch sensor.

Further, a charging voltage or a driving voltage for a touch detection is applied to the sensing pad, and a DC voltage having a predetermined size or a ground voltage based on 0 V or a voltage to ground for driving a display is applied to the non-sensing pad.

FIGS. 11 and 12 are diagrams illustrating an example in which a touch layer detecting a pressure touch and an elastic member are installed according to an exemplary embodiment of the present invention. Referring to FIG. 11, a touch layer 1102 in which a touch sensor and a sensor line for a touch detection are formed may be disposed at an upper side of a display module 1101, an elastic member 1103 may be disposed at an upper side of the touch layer 1102, and a passivation film, a flexible glass 1104, and the like may be disposed at the upper side of the elastic member.

The display module 1101 may be an LCD module or an OLED module, and the elastic member 1103 and the passivation film or the flexible glass 1104 may have, for example, elastic force so that a corresponding portion is bent when pressure is applied by a touch input means.

Referring to FIG. 12, a touch layer 1201 in which a touch sensor and a sensor line for a touch detection are formed may be disposed inside a display module 1202, an elastic member 1203 may be disposed at an upper side of the display module 1202, and a passivation film, a flexible glass 1204, and the like may be disposed at the upper side of the elastic member 1203.

The display module 1202 may be an LCD module or an OLED module, and the elastic member 1203 and the passivation film or the flexible glass 1204 may have, for example, elastic force so that a corresponding portion is bent when pressure is applied by a touch input means.

Herein, as described above with reference to FIG. 11, a structure in which the touch layer is disposed at the upper side of the display module is referred to as an on-cell structure, and as described above with reference to FIG. 12, a structure in which the touch layer is disposed inside the display module may be referred to as an in-cell structure.

FIG. 13 is a diagram illustrating an example in which a pressure touch of a touch capacitance Ct is detected according to an exemplary embodiment of the present invention. Referring to FIG. 13, a touch layer 1302 in which a touch sensor and a sensor line for a touch detection are formed may be disposed at an upper side of a display module 1301, an elastic member 1303 may be disposed at an upper side of the touch layer 1302, and a passivation film, a flexible glass 1304, and the like may be disposed at an upper side of the elastic member.

The display module 1301 may be an LCD module or an OLED module, and the elastic member 1303 and the passivation film or the flexible glass 1304 may have, for example, elastic force so that a corresponding portion is bent when a user touches the display module by using a finger and then applies pressure as illustrated in FIG. 13.

In this case, a spacing distance between the finger of the user and the touch layer is decreased, so that the touch capacitance Ct used for the touch detection is changed to Ct'. Herein, a method of detecting the touch capacitance Ct will be described below in detail.

The change in the touch capacitance is a value corresponding to the pressure of the touching finger of the user. That is, a first touch by an approach or a contact of a touch input means, such as a finger of a user and a second touch by pressure of the touch input means may be discriminated and recognized.

As described above, the exemplary embodiment described with reference to FIG. 13 may be applied to the on-cell structure in which the touch layer is disposed at the upper side of the display module as illustrated in FIG. 11, and may also be equally applied to the in-cell structure in which the touch layer is disposed inside the display module as illustrated in FIG. 12.

FIG. 14 is a diagram illustrating an example in which a touch layer detecting a pressure touch, an elastic member, and a common electrode are installed according to an exemplary embodiment of the present invention.

Referring to FIG. 14, a touch layer 1404 in which a touch sensor and a sensor line for a touch detection are formed may be disposed between a passivation film or a flexible glass 1405 and an elastic member 1404, and a display module 1401 may be disposed at a lower side of the elastic member 1404.

The display module 1401 may be an LCD module or an OLED module, and the elastic member 1403 and the passivation film or the flexible glass 1405 may have, for example, elastic force so that a corresponding portion is bent when pressure is applied by a touch input means, and a common electrode 1402 may be included inside the display module 1401.

For reference, the touch layers 1102 and 1201 of FIGS. 11 and 12 are disposed at the lower sides of the elastic members 1103 and 1203, but the touch layer 1404 of FIG. 14 is disposed at the upper side of the elastic member 1403.

FIG. 15 is a diagram illustrating an example in which a pressure touch of a common voltage capacitance Cvcom is detected according to an exemplary embodiment of the present invention. Referring to FIG. 15, a touch layer 1504 in which a touch sensor and a sensor line for a touch detection are formed may be disposed between a passivation film or a flexible glass 1505, which has elastic force so that a corresponding portion is bent when pressure is applied by a touch input means, and an elastic member 1503 as described above.

For example, when a user inputs a pressure touch by using a finger, a spacing distance between the touch sensor of a corresponding portion to which the pressure touch is applied and the common electrode is decreased, so that common voltage capacitance used for the touch detection is changed from Cvcom to Cvcom'. Herein, a method of detecting the common voltage capacitance Cvcom will be described below in detail.

The change in the common voltage capacitance is a value corresponding to the pressure of the touching finger of the user. That is, a first touch by an approach or a contact of a touch input means, such as a finger of a user and a second touch by pressure of the touch input means may be discriminated and recognized.

FIG. 16 is a diagram illustrating an example of a touch detecting circuit diagram according to an exemplary embodiment of the present invention, and FIG. 17 is a cross-sectional view illustrating an example of a basic configuration in which touch capacitance and common voltage capacitance are detected according to an exemplary embodiment of the present invention.

Referring to FIG. 16, a touch detecting circuit 1600 may include a touch sensor 1610, a charging circuit 1612, a touch input detecting unit 1614, and the like, and the touch sensor 1610 is an electrode patterned for detecting a touch input.

The touch sensor 1610 forms touch capacitance Ct with a touch input tool, for example, a finger 1625 of a user.

Referring to FIG. 17, touch sensors 1710 may be formed on a lower surface (or an upper surface) of a flexible substrate 1715, for example, a glass or a film, and may be arranged in a dot matrix form and the like.

A common electrode 1758 included inside a display module 1750 may be disposed at a lower side of the touch sensor 1710. Herein, the display module 1750 may be various types of display devices, such as an LCD or an OLED, as described above, and a common voltage Vcom of a display device, such as an LCD or an OLED, may be applied to the common electrode 1758.

A common voltage which is alternated at a predetermined frequency may be applied to the common electrode 1758, and a common voltage applied to the common electrode 1758 may be uniformly maintained, or when the common electrode 1758 is grounded with a ground signal, a different alternating voltage may be applied to the common electrode 1758.

Herein, common electrode capacitance Cvcom is formed between the touch sensor 1710 and the common electrode 1758, and when a specific charging signal is applied to the touch sensor 1710, the common electrode capacitance Cvcom has a predetermined level voltage by a charged voltage.

In this case, one end of the common electrode capacitance Cvcom is grounded with the common electrode 1758, so that a potential of the touch sensor 1710 that is the other end of the common electrode capacitance Cvcom may be changed by an alternating electric field applied to the common electrode 1758. That is, the potential of the touch sensor 1710 is voltage-changed by the common electrode capacitance Cvcom.

The "Ct" and "Cvcom" are the symbols expressing both the names and the sizes of the capacitors, and for example, "Ct" means a capacitor having a name of Ct and also means capacitance having a size of Ct.

Referring to FIG. 16, the charging circuit 1612 is a circuit which selectively supplies a charging signal to the touch sensor 1610 at a required time. The charging circuit 1612 may be a three-terminal type switch element performing a switching operation according to a control signal supplied to an on/off control terminal, or a linear element, such as an operational amplifier (OP-AMP), supplying a signal according to a control signal.

The Ct and the Cvcom affected to the touch sensor 1610 are connected to an output terminal of the charging circuit 1612. Accordingly, when a charging signal, such as a predetermined voltage or current, is applied to an input terminal of the charging circuit 1612 in a state where the charging circuit 1612 is turned on, the Ct and the Cvcom are charged. In this case, a parasitic capacitance Cp (not illustrated) may also be charged. Then, when the charging circuit 1612 is turned off, the charged signal is isolated unless the signal charged in the Ct and the Cvcom is separately discharged.

In order to stably isolate the charged signal, an input terminal of the touch input detecting unit 1614 has high impedance (Hi-impedance or Hi-z). When a touch input is observed while the signal charged in the Ct and the Cvcom is discharged, the charging signal is isolated by another means, or a signal is rapidly observed at a discharge initiation time, the input terminal of the touch input detecting unit 1614 does not need to be essentially Hi-z.

The touch input detecting unit 1614 detects whether a signal level of the touch sensor 1610 is shifted. The touch input detecting unit 1614 may detect whether a level shift is generated in a voltage variation in the touch sensor 1610 when a touch is generated (that is, the Ct is added to the Cvcom in parallel) and obtain a touch signal, in preparation of a voltage variation in the touch sensor 1610 when a touch is not generated (that is, the Ct is not formed).

Referring to FIG. 17, touch capacitance Ct is formed between a finger 1725 of the user and the touch sensor 1710, and common electrode capacitance Cvcom is formed between the touch sensor 1710 and the common electrode 1758.

For example, a voltage variation in the touch sensor 1710 by the Cvcom when a touch is not generated is determined by Equation 1 below.

$$\Delta Vsensor = \pm (VcomH - VcomL)\frac{Cvcom}{Cvcom + Cp} \quad \langle\text{Equation 1}\rangle$$

When a touch is generated, the Ct is added to the Cvcom in parallel, so that a voltage variation in the touch sensor 1710 is determined by Equation 2 below.

$$\Delta Vsensor = \pm (VcomH - VcomL)\frac{Cvcom}{Cvcom + Cp + Ct} \quad \langle\text{Equation 2}\rangle$$

In Equations 1 and 2, ΔVsensor is a voltage change portion in the touch sensor, VcomH is a high level voltage of the common electrode, VcomL is a low level voltage of the common electrode, Cvom is common electrode capacitance, Cp is parasitic capacitance, and Ct is touch capacitance. The touch input detecting unit 1614 detects a level shift in the touch sensor 1610 by using Equations 1 and 2. This will be described below in detail.

In Equations, VcomH and VcomL are easily settable values. Further, Cvcom may be obtained from Equation 3 below.

$$Cvcom = \varepsilon\frac{S1}{D1} \quad \langle\text{Equation 3}\rangle$$

In Equation 3, ε is permittivity of a medium present between the touch sensor 1710 and the common electrode 1758. For example, relative permittivity of glass has 3 to 5, so that permittivity of the substrate 1715 may be obtained by multiplying relative permittivity of glass by permittivity of vacuum. Further, permittivity of other media may be obtained by the same scheme. S1 is a opposite area of the touch sensor 1710 and the common electrode 1758, so that S1 may be easily obtained.

As illustrated in FIG. 17, when the common electrode 1758 is formed throughout an internal side of the display module 1750, an opposing area is determined by an area of the touch sensor 1710. Further, D1 is a distance between the touch sensor 1710 and the common electrode 1758, and corresponds to a thickness of a medium.

Herein, referring to FIG. 17, one or more media are present between the touch sensor 1710 and the common electrode 1758. When the medium is present, Cvcom is the same as that when capacitors generated in facing surfaces of respective dielectric substances are serially connected, so that Cvcom may be obtained therefrom. As described above, Cvcom is an easily obtainable value and is an easily settable value.

Ct may be obtained from Equation 4 below.

$$Ct = \varepsilon\frac{S2}{D2} \quad \langle\text{Equation 4}\rangle$$

In Equation 4, ε may be obtained from a medium between the touch sensor 1710 and the finger 1725. When glass is attached onto an upper surface of the substrate 1715 in FIG. 7, permittivity ε may be obtained from a value obtained by multiplying relative permittivity of glass by permittivity of vacuum. S2 corresponds to a facing area of the touch sensor 1710 and the finger 1725. When the finger 1725 covers the entirety of the specific touch sensor 1710, S2 corresponds to an area of the touch sensor 1710. When the finger 1725 covers a part of the touch sensor 1710, S2 decreases as much as an area which does not face the finger 1725 in the area of the touch sensor 1710.

Further, D2 is a distance between the touch sensor 1710 and the finger 1725, so that D2 may correspond to a thickness of glass, a passivation panel, and the like laid on the upper surface of the substrate 1715. As described above, Ct is also an easily obtainable value and is a value easily settable by using the passivation panel and the like laid on the substrate 1715.

Particularly, according to Equation 4, Ct is in proportional to the facing area of the finger 1725 and the touch sensor 1710, so that a touch share of the finger 1725 with respect to the touch sensor 1710 may be calculated from Ct. The touch input detecting unit 1614 detects whether a level shift is generated in a voltage change by Equation 2 in preparation to a voltage change by Equation 1.

According to the exemplary embodiment of the present invention, the touch input detecting unit 1614 may detect the change from Ct to Ct' by the pressure touch of the user as described above with reference to FIG. 13, or may detect the change from Cvcom to Cvcom' by the pressure touch of the user as described above with reference to FIG. 15.

FIG. 18 is a diagram illustrating an example in which a touch screen is divided into a first region and a second region according to an exemplary embodiment of the present invention. Referring to FIG. 18, a touch screen may be applied to various types of display devices, such as a smart phone 1800, and the smart phone 1800 may be divided into a non-display region 1810 and a display region 1820.

The display region may be divided into a center first region and an outer second region 1830, and according to the exemplary embodiment of the present invention, the outer second region 1830 may be divided into the plurality of sub regions.

For example, the outer second region 1830 may be divided into first to third sub regions 1831, 1832, and 1833, and when a pressure touch is detected in the outer second region, a predetermined specific operation among a volume control, a power control, a reset control, and the like may be rapidly performed.

Before the predetermined specific operation is performed, a mode switch operation, a guide display operation representing the mode switch, and the like may be first performed and then, the specific operation among the volume control, the power control, the reset control, and the like may also be performed.

Herein, the center first region may also be divided into the plurality of sub regions, and may be used for detecting the pressure touch and rapidly performing a predetermined specific operation.

FIG. 19 is a circuit diagram of a portable terminal to which the exemplary embodiment of the present invention is applied. Referring to FIG. 19, the portable terminal 1900 may include a control unit 1910, a touch screen 1920, an audio processing unit 1930, an interface unit 1940, a communication unit 1950, a storage unit 1960, and the like.

The control unit 1910 may be a processor or a controller which is linked with the touch screen 1920 and performs or controls a general operation of the portable terminal.

According to the exemplary embodiment of the present invention, the control unit 1910 may be linked with the touch screen 1920 which is divided into a center first region and an outer second region as described above, and perform an operation corresponding to a touch detected in the touch screen 1920.

For example, when a first touch by an approach or a contact of a touch input means is detected in the first region corresponding to the center portion of the touch screen, the control unit 1910 performs a first operation corresponding to a position of the first touch.

In the meantime, when a second touch by pressing of the touch input means is detected in the second region corresponding to the outer portion of the touch screen, the control unit 1910 may perform a second operation corresponding to a pressure of the second touch.

For example, the second operation is previously set for controlling one or more of the functions of the display device, and may be at least one of a volume control, a power control, and a reset control of the display device.

In the meantime, when the second touch is detected in the second region, the control unit 1910 may compare the pressure of the second touch with a predetermined reference value, and perform the second operation corresponding to the pressure of the second touch or perform a different second operation according to a difference between the pressure of the second touch and the reference value.

For example, when pressures of touches applied by a user are different in the same sub region of the second region, different second operations may be performed even though the touch positions are the same. For example, even though the touch position is the same, when a difference between the pressure of the touch and the reference value is small, a volume control operation may be performed, and when a difference between the pressure of the touch and the reference value is large, a power control operation may be performed.

Those skilled in the art will appreciate that the present invention is not limited by the foregoing exemplary embodiment and the accompanying drawings, and may be variously substituted, modified, and changed within the range of the technical spirit of the present invention.

What is claimed is:

1. An organic light emitting diode (OLED) display device including a touch screen, the OLED display device comprising: a plurality of pixels including organic light emitting bodies; and a common electrode which applies a common voltage to the organic light emitting body, wherein a plurality of touch sensors and a plurality of sensor lines are formed in a mesh pattern and disposed in a partial region in the same layer as the common electrode corresponding to a boundary region between the organic light emitting bodies.

2. The OLED display device of claim 1, wherein the boundary region between the organic light emitting bodies and the partial region of the common electrode are vertically positioned on the same line.

3. The OLED display device of claim 1, wherein the plurality of touch sensors and the plurality of sensor lines are formed by one mask with the common electrode.

4. The OLED display device of claim 1, wherein the plurality of touch sensors is divided into sensing pads which detect a touch and non-sensing pads which do not detect a touch by a sequential scheme which follows a predetermined order.

5. The OLED display device of claim 1, wherein
the plurality of touch sensors and the plurality of sensor lines are vertically positioned on the same line with a source line or a gate line driving the pixel.

6. The OLED display device of claim 1, wherein the plurality of touch sensors is disposed in a dot matrix structure, and
the plurality of touch sensors has a different area according to a spacing distance between the touch sensor and a touch drive IC.

7. An organic light emitting diode (OLED) display device including a touch screen, the OLED comprising: a plurality of pixels including organic light emitting bodies; and a common electrode which applies a common voltage to the organic light emitting body, wherein touch sensors and sensor lines are formed in a mesh pattern and disposed at an upper side of a partial region on the layer of the common electrode corresponding to a boundary region between the organic emitting bodies.

8. The OLED display device of claim 7, wherein the boundary region between the organic light emitting bodies and the partial region of the common electrode are vertically positioned on the same line.

9. The OLED display device of claim 7, wherein the plurality of touch sensors and the plurality of sensor lines are formed by one mask with the common electrode.

10. The OLED display device of claim 7, wherein the plurality of touch sensors is divided into sensing pads which detect a touch and non-sensing pads which do not detect a touch by a sequential scheme which follows a predetermined order.

11. The OLED display device of claim 7, wherein the plurality of touch sensors and the plurality of sensor lines are vertically positioned on the same line with a source line or a gate line driving the pixel.

12. The OLED display device of claim 7, wherein the plurality of touch sensors is disposed in a dot matrix structure, and
the plurality of touch sensors has a different area according to a spacing distance between the touch sensor and a touch drive IC.

* * * * *